(12) United States Patent
Tang et al.

(10) Patent No.: US 11,195,899 B2
(45) Date of Patent: Dec. 7, 2021

(54) DISPLAY SUBSTRATE, DISPLAY PANEL, DISPLAY DEVICE AND METHOD FOR MANUFACTURING DISPLAY SUBSTRATE

(71) Applicants: Chengdu BOE Optoelectronics Technology Co., Ltd., Sichuan (CN); BOE TECHNOLOGY GROUP CO., LTD., Beijing (CN)

(72) Inventors: Guoqiang Tang, Beijing (CN); Yingsong Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 16/606,289

(22) PCT Filed: Jan. 28, 2019

(86) PCT No.: PCT/CN2019/073343
§ 371 (c)(1),
(2) Date: Oct. 18, 2019

(87) PCT Pub. No.: WO2019/169975
PCT Pub. Date: Sep. 12, 2019

(65) Prior Publication Data
US 2021/0193770 A1      Jun. 24, 2021

(30) Foreign Application Priority Data
Mar. 9, 2018   (CN) .......................... 201810195120.X

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 27/3218* (2013.01); *H01L 51/0097* (2013.01); *H01L 51/56* (2013.01); *H01L 2227/323* (2013.01)

(58) Field of Classification Search
None
See application file for complete search history.

(56) References Cited

U.S. PATENT DOCUMENTS

2008/0157235 A1*   7/2008   Rogers ................. H05K 1/0283
                                              257/415
2009/0009703 A1   1/2009   Tamaki et al.
(Continued)

FOREIGN PATENT DOCUMENTS

CN   101339336 A   1/2009
CN   105845702 A   8/2016
(Continued)

*Primary Examiner* — J. E. Schoenholtz
(74) *Attorney, Agent, or Firm* — Calfee, Halter & Griswold LLP

(57) ABSTRACT

A display substrate and a method for manufacturing the same. The display substrate includes a stretchable substrate and a signal line on a first surface of the stretchable substrate. The first surface of the stretchable substrate is provided with a plurality of grooves spaced apart from each other, and the signal line includes a first portion within the grooves and a second portion outside the grooves.

18 Claims, 4 Drawing Sheets

(56) References Cited

U.S. PATENT DOCUMENTS

| | | | |
|---|---|---|---|
| 2016/0227623 A1* | 8/2016 | Yoo | H01L 51/0097 |
| 2016/0268352 A1* | 9/2016 | Hong | H01L 51/0097 |
| 2019/0019593 A1* | 1/2019 | Guo | H01L 51/5203 |

FOREIGN PATENT DOCUMENTS

| | | |
|---|---|---|
| CN | 106227380 A | 12/2016 |
| JP | 2007194265 A | 8/2007 |

* cited by examiner

DISPLAY SUBSTRATE, DISPLAY PANEL, DISPLAY DEVICE AND METHOD FOR MANUFACTURING DISPLAY SUBSTRATE

RELATED APPLICATION

This application is the U.S. national phase entry of PCT Application No. PCT/CN2019/073343, filed Jan. 28, 2019, which is based upon and claims the benefit of Chinese Patent Application No. 201810195120.X, filed on Mar. 9, 2018, the entire disclosure of which is incorporated herein by reference.

TECHNICAL FIELD

The present disclosure relates to the field of display technology, and particularly to a display substrate, a display panel, a display device and a method for manufacturing a display substrate.

BACKGROUND

Recently, stretchable display panels have emerged in the field of display technology. In addition to being able to bend, fold and roll, a stretchable display panel can withstand pressure and tensile force, which can avoid or mitigate occurrence of collision and cracking. The stretchable display panel is applicable in fields such as wearable devices, Internet of Things(IOT) devices, automobiles, artificial intelligence, and the like.

In the related art, a stretchable display panel mainly achieves a stretching effect by means of a substrate having a relatively flat shape and a certain tensile property.

SUMMARY

An exemplary embodiment provides a display substrate, the display substrate comprising: a stretchable substrate, a first surface of the stretchable substrate comprising a plurality of grooves spaced apart from each other; and a signal line on the first surface of the stretchable substrate, the signal line comprising a first portion within the grooves and a second portion outside the grooves.

In some exemplary embodiments, the first surface of the display substrate comprises an array of sub-pixel regions, an orthographic projection of each sub-pixel region on a second surface of the stretchable substrate opposite to the first surface does not overlap orthographic projections of the plurality of grooves on the second surface.

In some exemplary embodiments, the display substrate further comprises an array of light emitting elements on the first surface of the stretchable substrate, each light emitting element is located within a corresponding sub-pixel region of the array of sub-pixel regions, and the signal line is electrically connected to a row or a column of light emitting elements in the array of light emitting elements.

In some exemplary embodiments, the signal line comprises a first signal line and a second signal line, the first signal line extends along a first direction, and the second signal line extends along a second direction different from the first direction, each of the first signal line and the second signal line comprises the first portion within the grooves and the second portion outside the grooves, the first portion of the first signal line and the first portion of the second signal line within each of the plurality of grooves are isolated from each other by an elastic insulating material.

In some exemplary embodiments, the first signal line comprises a gate line, the second signal line comprises a data line, and the gate line and the data line intersects each other to define the array of sub-pixel regions on the first surface.

In some exemplary embodiments, the first portion of the second signal line that is located within each of the plurality of grooves exhibits a curved shape.

In some exemplary embodiments, each of the plurality of grooves is a spherical groove.

In some exemplary embodiments, the second direction is perpendicular to the first direction.

In some exemplary embodiments, the plurality of grooves form a groove array, each gate line extends along a row of grooves in the groove array, each data line extends along a column of grooves in the groove array.

In some exemplary embodiments, the stretchable substrate is made of polydimethylsiloxane.

In some exemplary embodiments, the first portion of the signal line within the grooves has a width greater than that of the second portion of the signal line outside the grooves.

In some exemplary embodiments, the first direction is a length direction of the stretchable substrate, and the second direction is a width direction of the stretchable substrate.

In some exemplary embodiments, the array of sub-pixel regions comprises a red sub-pixel region, a blue sub-pixel region, and a green sub-pixel region.

In some exemplary embodiments, the display substrate comprises an LED display substrate or an OLED display substrate.

Another exemplary embodiment provides a display panel, comprising the display substrate according to any one of the foregoing embodiments.

Another exemplary embodiment provides a display device comprising the display panel according to the above embodiment.

Yet another exemplary embodiment provides a method for manufacturing a display substrate, the method comprising: forming a plurality of grooves spaced apart from each other on a first surface of a stretchable substrate, and forming a signal line on the first surface of the stretchable substrate, the signal line comprising a first portion within the grooves and a second portion outside the grooves.

In some exemplary embodiments, the signal line comprises a first signal line and a second signal line, the forming the signal line on the first surface of the stretchable substrate comprises: forming the first signal line along a first direction on the first surface of the stretchable substrate on which the plurality of grooves have been formed, a portion of the first signal line being within the grooves and the other portion of the first signal line being outside the grooves; filling the grooves where the portion of the first signal line has been formed with an elastic insulating material, and forming the second signal line on the first surface of the stretchable substrate on which the elastic insulating material has been formed along a second direction different from the first direction, a portion of the second signal line being on the elastic insulating material, the other portion of the second signal line being outside the grooves.

In some exemplary embodiments, the first signal line is a gate line, the second signal line is a data line, and the plurality of grooves forms a groove array, the forming the first signal line along the first direction on the first surface of the stretchable substrate on which the plurality of grooves have been formed comprises: forming the gate line along groove surfaces of a row of grooves in the groove array, and the forming the second signal line along the second direction on the first surface of the stretchable substrate on which the elastic insulating material has been formed comprises: forming the data line along a surface of the elastic insulating material in a column of grooves in the groove array.

In some exemplary embodiments, the forming the second signal line on the first surface of the stretchable substrate on which the elastic insulating material has been formed along the second direction comprises: forming a metal thin film layer on the first surface of the stretchable substrate on which the elastic insulating material has been formed, and etching the metal thin film layer to form the second signal line, a portion of the second signal line within each of the plurality of grooves exhibiting a curved shape.

In some exemplary embodiments, the forming the plurality of grooves on the first surface of the stretchable substrate comprises: etching the stretchable substrate to form the plurality of grooves.

BRIEF DESCRIPTION OF THE DRAWINGS

In order to more clearly illustrate the technical solutions in exemplary embodiments, the drawings to be used for description of the exemplary embodiments will be briefly described below. The drawings in the description below only illustrate part of the embodiments of the present disclosure. Those of ordinarily skill in the art can obtain other embodiments based on these drawings without inventive efforts.

DETAILED DESCRIPTION

To make the purpose, technical solutions and advantages of the present disclosure clearer, exemplary embodiments will be further described in detail below with reference to the accompanying drawings. The drawings and literal descriptions thereof are only intended to illustrate some exemplary embodiments, but the scope of the present application is not so limited. Knowing the disclosure of the application, those skilled in the art may make any appropriate modifications or variations to the described exemplary embodiments without departing from the spirit and scope revealed herein. These modifications or variations also fall within the scope of the present application.

The inventors have found that the existing stretchable display panel can be stretchable only along a direction parallel to the substrate thereof, so that the stretching effect is simple.

Figure 1:
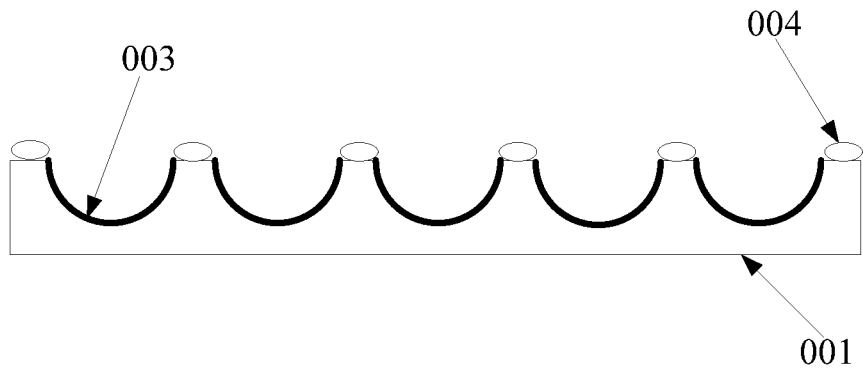
FIG. 1 is a schematic sectional view of a display substrate provided by an exemplary embodiment.

FIG. 1 schematically shows a side view of a display substrate provided by an exemplary embodiment. The display substrate provided by an exemplary embodiment comprises a stretchable substrate 001. A first surface of the stretchable substrate 001 comprises a plurality of grooves spaced apart from each other. The display substrate further comprises a signal line 003 on the first surface of the stretchable substrate 001, and the signal line 003 comprises a first portion within the grooves and a second portion outside the grooves. In some exemplary embodiments, the plurality of grooves may be arranged in a matrix. By way of example, each groove may be a spherical groove, which is more advantageous for preventing occurrence of wire breakage. The display substrate mentioned herein includes, but is not limited to, an organic light emitting diode (OLED) display substrate, an LED display substrate, an array substrate in a liquid crystal display device, and the like. According to some exemplary embodiments, the first surface of the display substrate comprises an array of sub-pixel regions. An orthographic projection of each sub-pixel region on a second surface of the stretchable substrate opposite to the first surface does not overlap the orthographic projections of the plurality of grooves on the second surface. FIG. 1 schematically shows a plurality of sub-pixels 004. The orthographic projection of each sub-pixel 004 on the second surface of the stretchable substrate 001 does not overlap the orthographic projection of the grooves on the second surface. By way of example, the plurality of sub-pixels may include a red sub-pixel, a blue sub-pixel, and a green sub-pixel.

According to some exemplary embodiments, the display substrate further comprises an array of light emitting elements on the first surface of the stretchable substrate, each light emitting element of the array of light emitting elements is arranged within a corresponding sub-pixel region of the array of sub-pixel regions, and each signal line is electrically connected to a row or a column of light emitting elements in the array of light emitting elements. That is to say, signals required for normal operation of the light emitting elements in respective sub-pixel regions may be transmitted through these signal lines, or these signal lines may also output relevant electrical signals from the light emitting elements in respective sub-pixel regions.

According to some exemplary embodiments, the stretchable substrate may be made of polydimethylsiloxane (PMDS).

In some exemplary embodiments, a width of the first portion of the signal line within the grooves is larger than that of the second portion of the signal line outside the grooves. The larger the width of the signal line is, the smaller the overall resistance of the signal line is, and the smaller the voltage drop generated by the signal line will be. Therefore, the width of the first portion of the signal line within the grooves being greater than that of the second portion of the signal line outside the grooves is advantageous to improving the display effect of the display panel.

Figure 2:
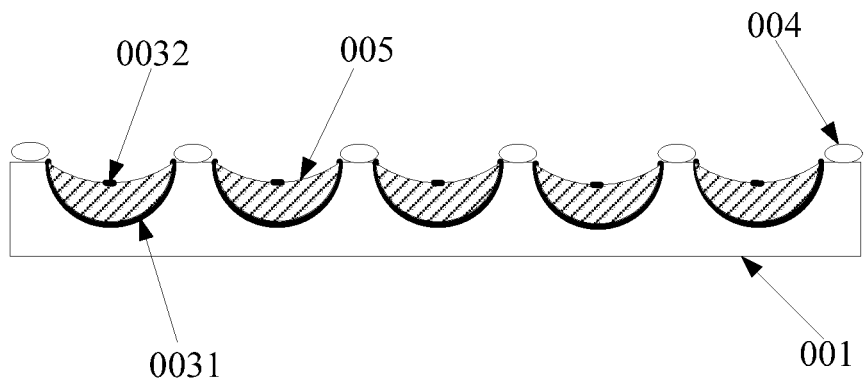
FIG. 2 is a schematic sectional view of a display substrate provided by another exemplary embodiment.

According to some exemplary embodiments, referring to FIG. 2, the signal line may comprise a first signal line 0031 and a second signal line 0032. The first signal line 0031 extends in a first direction, and the second signal line 0032 extends in a second direction different from the first direction. The first signal line 0031 and the second signal line 0032 each comprise a first portion within the grooves and a second portion outside the grooves. The first portion of the first signal line and the first portion of the second signal line within each groove are isolated from each other by an elastic insulating material. For example, in the example of FIG. 2, the length direction of the first signal line 0031 is parallel to the first direction, a portion of the first signal line 0031 is located within the grooves, and the other portion is outside the grooves. Each groove where the first signal line 0031 is formed is filled with an insulating separator 005, and the insulating separator 005 is made of an elastic material. The length direction of the second signal line 0032 is parallel to the second direction, a portion of the second signal line 0032 is above the insulating separator 005 within the groove, and the other portion is located outside the groove. The second direction intersects the first direction. In some exemplary embodiments, the second direction may be perpendicular to the first direction. In case the second direction is perpendicular to the first direction, by way of example, the first direction may be the length direction of the stretchable substrate, and the second direction may be the width direction of the stretchable substrate.

According to some exemplary embodiments, the first signal line 0031 comprises a gate line, and the second signal line 0032 comprises a data line. The gate lines and the data lines intersect each other to define the array of sub-pixel regions on the first surface. In exemplary embodiments in which the plurality of grooves are arranged in an array, each gate line may extend along a row of grooves in the array of grooves, and each data line may extend along a column of grooves in the array of grooves. Further, in some exemplary embodiments, the first portion of the second signal line that is within each groove exhibits a curved shape, so that the second signal line is able to be stretched when the display substrate is being stretched, thereby improving the tensile property of the display substrate. For example, the first portion of the second signal line within each groove may be S-shaped.

In some examples described above, embodiments of the disclosure are described based on an example in which the signal line comprises a gate line and a data line, but exemplary embodiments are not limited thereto. In further exemplary embodiments, the signal line that may be disposed on the stretchable substrate may comprise: a control signal line (e.g., a light emission control signal line that controls whether the light emitting function of each sub-pixel is enabled), a reset line, a reference potential line, a power signal line (i.e., Vdd line), and the like. The type of the signal line is not limited in embodiments of the present disclosure.

In summary, the display substrate provided by exemplary embodiment shave a stretchable substrate, and the first surface of the stretchable substrate is provided with a plurality of grooves spaced apart from each other. The display substrate further comprises a signal line disposed on the first surface of the stretchable substrate, and the signal line comprises a first portion within the grooves and a second portion outside the grooves. Since a portion of the signal line is located within the groove, the display substrate can be stretched in different directions, for example, it may be stretched in a direction parallel to the stretchable substrate, and may also be stretched towards a direction perpendicular to the stretchable substrate, thereby enriching the stretching effect of the display substrate.

Another exemplary embodiment provides a display panel, which may comprise the display substrate described in any of the foregoing embodiments. Accordingly, the display panel may be an LCD panel, an LED display panel, an OLED display panel, or the like.

A further exemplary embodiment further provides a display device comprising the display panel described in the foregoing embodiments. The display device may be any product or component having a display function, such as a mobile phone, a tablet computer, a television, a display, a notebook computer, a digital photo frame, a navigator, and the like.

Figure 3:
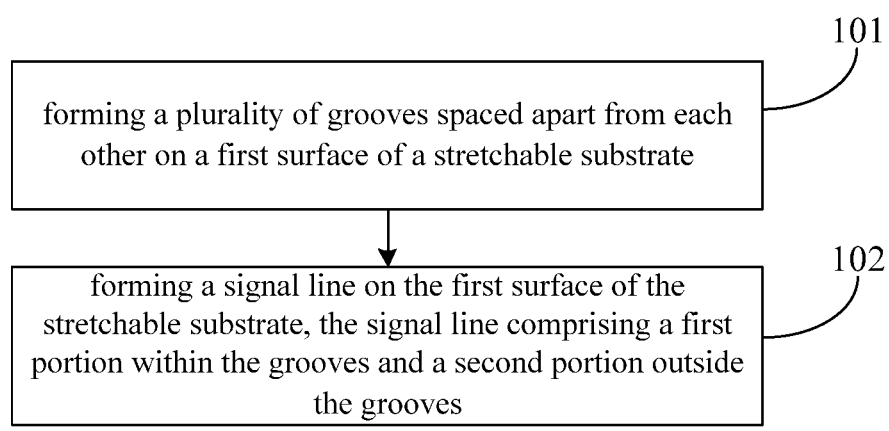
FIG. 3 is a flow chart of a method for manufacturing a display substrate provided by an exemplary embodiment.

An exemplary embodiment provides a method for manufacturing a display substrate. As shown in FIG. 3, the method comprises the following steps.

Step 101, forming a plurality of grooves spaced apart from each other on a first surface of a stretchable substrate.

Step 102, forming a signal line on the first surface of the stretchable substrate, the signal line comprising a first portion within the grooves and a second portion outside the grooves. By way of example, the display substrate in the exemplary embodiment may be an LED display substrate, an OLED display substrate, an array substrate in an LCD display device, or the like.

As for the method for manufacturing a display substrate provided by the exemplary embodiment, since a portion of the signal line is located within the grooves, the resulting display substrate can be stretched in different directions, for example, it may be stretched in a direction parallel to the stretchable substrate, and may also be stretched towards a direction perpendicular to the stretchable substrate, thereby enriching the stretching effect of the display substrate.

Figure 4:
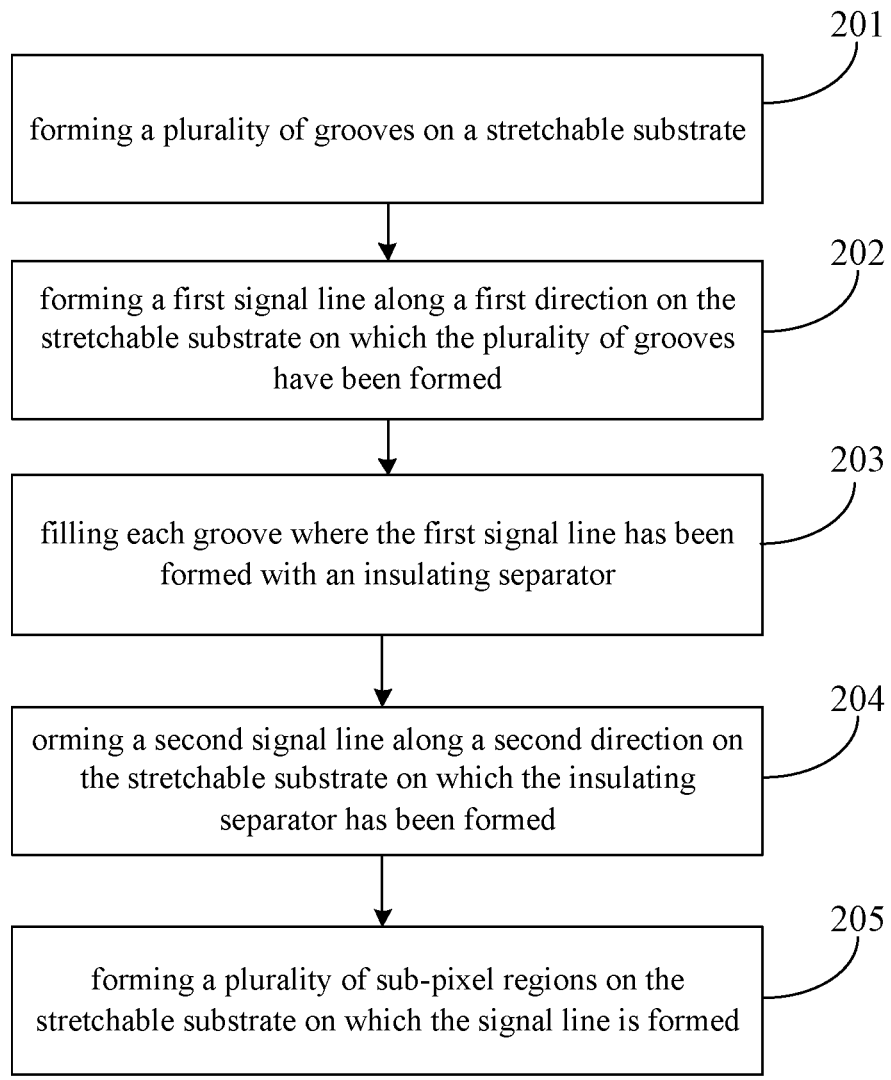
FIG. 4 is a flow chart of a method for manufacturing a display substrate provided by another exemplary embodiment.

FIG. 4 illustrates a method for manufacturing a display substrate provided by another exemplary embodiment. The method may comprise the following steps.

Step 201, forming a plurality of grooves on a first surface of a stretchable substrate.

Figure 5:
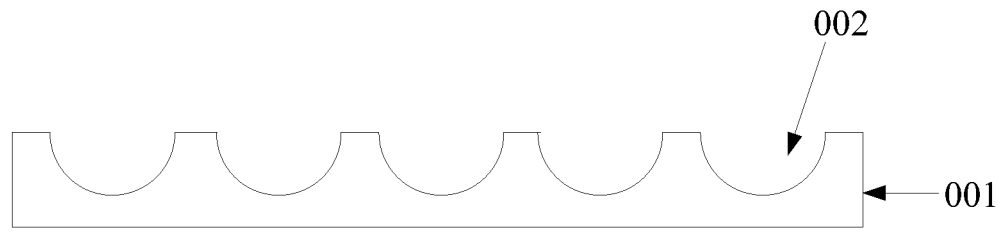
FIG. 5 schematically shows a side view of a stretchable substrate where grooves are formed according to an exemplary embodiment.

As shown in FIG. 5, a plurality of grooves 002 are formed on the first surface of a stretchable substrate 001. The plurality of grooves may be arranged in a matrix. FIG. 5 shows a side view of a stretchable substrate where grooves are formed.

In some exemplary embodiments, step 201 may comprise: etching the stretchable substrate to form a plurality of grooves. By way of example, dry etching may be performed for the stretchable substrate to form a plurality of grooves.

By way of example, as shown in FIG. 5, each groove may be a spherical groove. The spherical groove can effectively prevent occurrence of wire breakage in the display substrate.

Step 202, forming a first signal line along a first direction on the first surface of the stretchable substrate on which the plurality of grooves are formed. A portion of the first signal line is within a groove and the other portion thereof is outside the groove.

Figure 6:
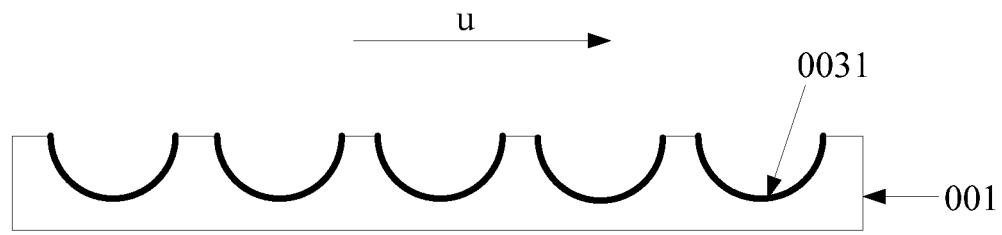
FIG. 6 schematically shows a side view of a stretchable substrate where a first signal line is formed according to an exemplary embodiment.

As shown in FIG. 6, a first signal line 0031 is formed along a first direction (the direction indicated by "u" in FIG. 6) on the first surface of the stretchable substrate 001 on which the plurality of grooves have been formed. A portion of the first signal line 0031 is located within a groove, and the other portion is located outside the groove. FIG. 6 illustratively shows portions of the first signal line that is located within the grooves.

Step 203, filling the groove in which the first signal line has been formed with an elastic insulating material.

Figure 7:
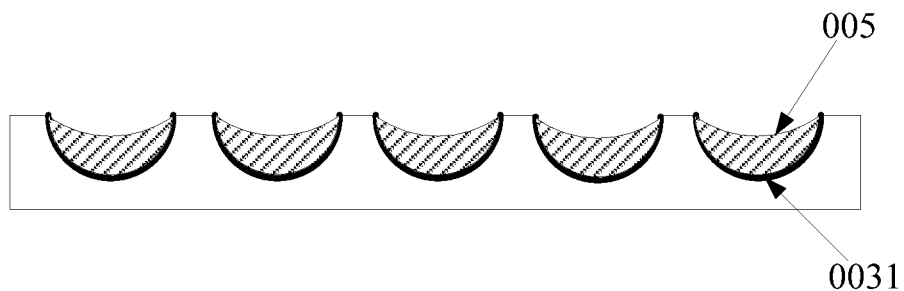
FIG. 7 schematically shows a side view of a stretchable substrate where an insulating separator is formed according to an exemplary embodiment.

As shown in FIG. 7, each groove in which the first signal line 0031 has been formed is filled with an elastic insulating material to form an insulating separator 005.

In some exemplary embodiments, the elastic property of the insulating separator is consistent with the elastic property of the stretchable substrate, thereby enhancing the stretching effect of the display substrate.

Figure 8:
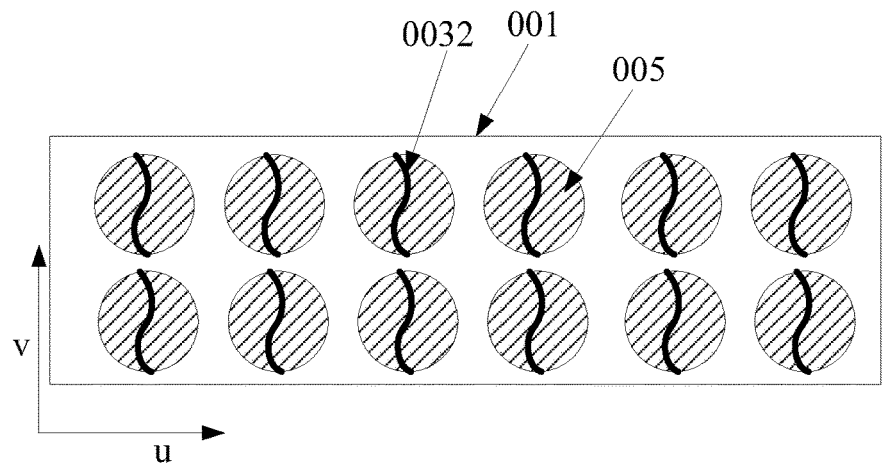
FIG. 8 schematically shows a top view of a stretchable substrate comprising a second signal line in the grooves as provided by an exemplary embodiment.

Step 204, forming a second signal line on the first surface of the stretchable substrate on which the elastic insulating material has been formed, along a second direction different from the first direction. A portion of the second signal line is on the elastic insulating material, and the other portion of the second signal line is outside the groove. FIG. 8 schematically shows a top view of a display substrate having the formed second signal line. The second signal line 0032 is formed along a second direction (the direction indicated by "v" in FIG. 8) on the stretchable substrate 001 on which the insulating separator 005 has been formed. A portion of the second signal line 0032 is on the insulating separator of the groove, and the other portion of the second signal line 0032 is outside the groove.

Thus, according to some exemplary embodiments, the signal line formed on the stretchable substrate comprises a first signal line and a second signal line, and an insulating separator is disposed between the first signal line and the second signal line to isolate the first signal line and the second signal line within the groove.

In some exemplary embodiments, as shown in FIG. 8, the second direction (the direction indicated by "v" in FIG. 8) is perpendicular to the first direction (the direction indicated by "u" in FIG. 8), that is, an angle between the second direction and the first direction is equal to 90 degrees. In case the second direction is perpendicular to the first direction, by way of example, the first direction may be the length direction of the stretchable substrate, and the second direction may be the width direction of the stretchable substrate.

In some exemplary embodiments, the width of the first portion of the signal line within the groove is greater than the width of the second portion of the signal line outside the groove. The larger the width of the signal line is, the smaller the overall resistance of the signal line is, and the smaller the voltage drop on the signal line will be. Therefore, making the width of the first portion of the signal line within a groove larger than the width of the second portion of the signal line outside the groove can improve the display effect of the display panel.

Figure 9:
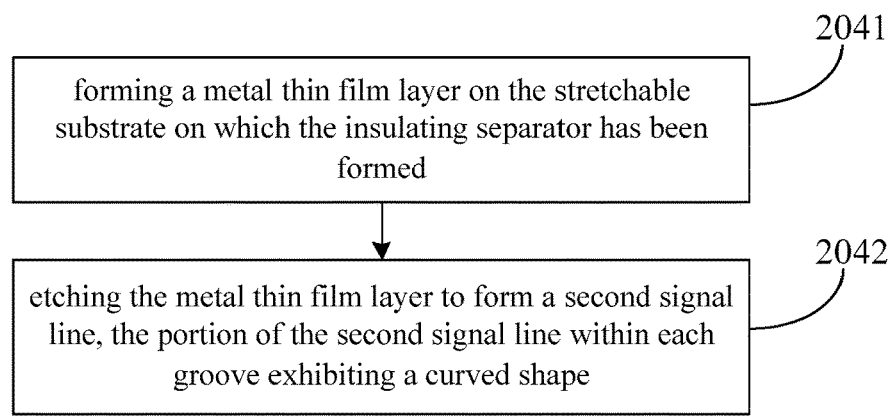
FIG. 9 is a flow chart of a method of forming the second signal line as provided by an exemplary embodiment.

According to some exemplary embodiments, as shown in FIG. 9, the above step 204 may comprise:

Step 2041, forming a metal thin film layer on the first surface of the stretchable substrate on which the elastic insulating material has been formed.

Step 2042, etching the metal thin film layer to form a second signal line, the portion of the second signal line located within each groove having a curved shape.

For example, dry etching may be performed for the metal thin film layer on the stretchable substrate to form the second signal line.

Step 205, forming a plurality of sub-pixel regions on the stretchable substrate on which the signal line has been formed.

Figure 10:
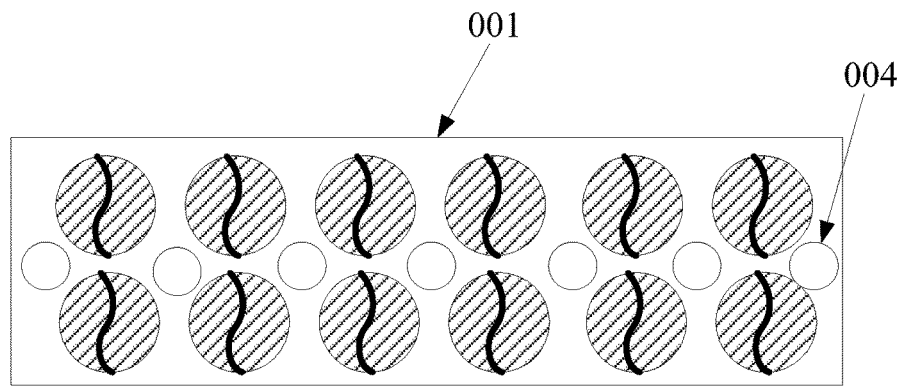
FIG. 10 is a schematic top view of the display substrate shown in FIG. 2.

As shown in FIG. 2, a plurality of sub-pixel regions 004 are formed on the stretchable substrate 001 on which the signal line has been formed. The plurality of sub-pixel regions may be arranged in a matrix. An orthographic projection of each sub-pixel region on a second surface of the stretchable substrate opposite to the first surface does not overlap the orthographic projections of the plurality of grooves on the second surface. A top view of the stretchable substrate 001 where the sub-pixel region 004 is formed as shown in FIG. 2 may refer to FIG. 10.

According to some exemplary embodiments, the first signal line formed in step 202 may be a gate line, and the second signal line formed in step 204 may be a data line. The plurality of grooves are arranged in an array. The gate lines and the data lines intersect each other to define the array of the sub-pixel regions on the first surface.

Correspondingly, the above step 202 may comprise forming a gate line along groove surfaces of a row of grooves in the array of grooves. The above step 204 may comprise forming a data line along a surface of the elastic insulating material in a column of grooves in the array of grooves.

Thus, the insulating separator formed of the elastic insulating material isolates the gate line and the data line within the groove, thereby facilitating achieving scan to the sub-pixels.

According to further exemplary embodiments, the signal line formed on the stretchable substrate may further include: a control signal line (e.g. a light emission control signal line that controls whether the light emitting function of each sub-pixel is enabled), a reset line, a reference potential line, a power signal line (i.e., Vdd line), and the like. The type of the signal line is not limited in embodiments.

For the display substrate manufactured by the method described in the exemplary embodiments, the groove in the stretchable substrate is able to prevent occurrence of wire breakage when the display substrate is stretched within a certain stress range, thereby improving the tensile property of the panel. It is to be noted that the order of the steps of the method for manufacturing a display substrate provided by exemplary embodiments herein may be appropriately adjusted, and some additional steps may be added or some steps may be omitted as needed. Any variations or modification to the methods that can be readily conceived by a skilled person familiar with this technical field within the technical scope revealed by the present disclosure shall be encompassed within the scope of the present application, which will not be described in detail.

In summary, with the manufacturing method for a display substrate provided by the exemplary embodiment, a plurality of grooves are formed in the stretchable substrate, a signal line is formed on the surface of the stretchable substrate where the grooves are formed, a first portion of the signal line is located within a groove, and a second portion of the signal line is outside the groove. As a result, the display substrate can be stretched in different directions, for example, it may be stretched in a direction parallel to the stretchable substrate, and may also be stretched towards a direction perpendicular to the stretchable substrate, thereby enriching the stretching effect of the display substrate.

What have been described above are some exemplary embodiments, those of ordinary skill in the art, when practicing the claimed solution, can understand and achieve other variants of the disclosed embodiments based on the study of the drawings, the description and the claims. In the claims, the wording such as "comprise" does not exclude the presence of other elements. Although some features are recited in different dependent claims, the present application is also intended to encompass embodiments in which these features are combined.

The invention claimed is:

1. A display substrate, comprising:
   a stretchable substrate, a first surface of the stretchable substrate comprising a plurality of grooves spaced apart from each other; and
   a signal line on the first surface of the stretchable substrate, the signal line comprising a first portion within the grooves and a second portion outside the grooves, wherein the signal line comprises a first signal line and a second signal line, the first signal line extends along a first direction, and the second signal line extends along a second direction different from the first direction, wherein each of the first signal line and the second signal line comprises the first portion within the grooves and the second portion outside the grooves, wherein the display substrate further comprises an elastic insulating material within each groove of the plurality of grooves, the elastic insulating material isolates the first portion of the first signal line from the first portion of the second signal line within the groove, and wherein an orthographic projection of the first portion of the first signal line on the stretchable substrate partially overlaps with an orthographic projection of the first portion of the second signal line on the stretchable substrate.

2. The display substrate according to claim 1, wherein the first surface of the display substrate comprises an array of sub-pixel regions, an orthographic projection of each sub-pixel region on a second surface of the stretchable substrate opposite to the first surface does not overlap orthographic projections of the plurality of grooves on the second surface.

3. The display substrate according to claim 2, wherein the display substrate further comprises an array of light emitting elements on the first surface of the stretchable substrate, each light emitting element is located within a corresponding sub-pixel region of the array of sub-pixel regions, and the signal line is electrically connected to a row or a column of light emitting elements in the array of light emitting elements.

4. The display substrate according to claim 2, wherein the first signal line comprises a gate line, the second signal line comprises a data line, and the gate line and the data line intersects each other to define the array of sub-pixel regions on the first surface.

5. The display substrate according to claim 4, wherein the first portion of the second signal line that is located within each of the plurality of grooves exhibits a curved shape.

6. The display substrate according to claim 1, wherein each of the plurality of grooves is a spherical groove.

7. The display substrate according to claim 4, wherein the second direction is perpendicular to the first direction.

8. The display substrate according to claim 5, wherein the plurality of grooves form a groove array, each gate line extends along a row of grooves in the groove array, each data line extends along a column of grooves in the groove array.

9. The display substrate according to claim 1, wherein the stretchable substrate is made of polydimethylsiloxane.

10. The display substrate according to claim 1, wherein the first portion of the signal line within the grooves has a width greater than that of the second portion of the signal line outside the grooves.

11. The display substrate according to claim 7, wherein the first direction is a length direction of the stretchable substrate, and the second direction is a width direction of the stretchable substrate.

12. The display substrate according to claim 2, wherein the array of sub-pixel regions comprises a red sub-pixel region, a blue sub-pixel region, and a green sub-pixel region.

13. The display substrate according to claim 1, wherein the display substrate comprises an LED display substrate or an OLED display substrate.

14. A display panel, comprising the display substrate according to claim 1.

15. A display device comprising the display panel according to claim 14.

16. A method for manufacturing a display substrate, comprising:

forming a plurality of grooves spaced apart from each other on a first surface of a stretchable substrate, and forming a signal line on the first surface of the stretchable substrate, the signal line comprising a first portion within the grooves and a second portion outside the grooves, wherein the signal line comprises a first signal line and a second signal line, wherein forming the signal line on the first surface of the stretchable substrate comprises:

forming the first signal line along a first direction on the first surface of the stretchable substrate on which the plurality of grooves have been formed, a portion of the first signal line being within the grooves and the other portion of the first signal line being outside the grooves;

filling the grooves where the portion of the first signal line has been formed with an elastic insulating material, and forming the second signal line on the first surface of the stretchable substrate on which the elastic insulating material has been formed along a second direction different from the first direction, a portion of the second signal line being on the elastic insulating material, the other portion of the second signal line being outside the grooves.

17. The method according to claim 16, wherein the first signal line is a gate line, the second signal line is a data line, and the plurality of grooves forms a groove array, wherein the forming the first signal line along the first direction on the first surface of the stretchable substrate on which the plurality of grooves have been formed comprises: forming the gate line along groove surfaces of a row of grooves in the groove array, wherein the forming the second signal line along the second direction on the first surface of the stretchable substrate on which the elastic insulating material has been formed comprises: forming the data line along a surface of the elastic insulating material in a column of grooves in the groove array.

18. The method according to claim 16, wherein the forming the second signal line on the first surface of the stretchable substrate on which the elastic insulating material has been formed along the second direction comprises:

forming a metal thin film layer on the first surface of the stretchable substrate on which the elastic insulating material has been formed, and etching the metal thin film layer to form the second signal line, a portion of the second signal line within each of the plurality of grooves exhibiting a curved shape.

* * * * *